United States Patent [19]

Goodall et al.

[11] 4,021,685
[45] May 3, 1977

[54] PULSE CIRCUIT FOR RESHAPING LONG LINE PULSES

[75] Inventors: Laurence Goodall, Staines; Eric John Leaton, Wokingham, both of England

[73] Assignee: Ferranti, Limited, Hollinwood, England

[22] Filed: July 2, 1975

[21] Appl. No.: 592,741

[52] U.S. Cl. .............................. 307/268; 178/68; 328/164
[51] Int. Cl.² ...................................... H03K 5/01
[58] Field of Search ......... 333/20; 307/268, 235 K, 307/261, DIG. 3; 328/34, 57, 61, 65, 164, 162, 114, 127; 325/13; 179/16 EA, 16 E

[56] References Cited
UNITED STATES PATENTS

| | | | |
|---|---|---|---|
| 2,508,569 | 5/1950 | Forbes | 333/20 |
| 2,759,047 | 8/1956 | Meacham | 328/164 X |
| 3,187,260 | 6/1965 | Dove | 178/68 UX |
| 3,254,326 | 5/1966 | Mann | 307/235 K |
| 3,287,574 | 11/1966 | Jenkins | 328/61 X |
| 3,760,198 | 9/1973 | Mori et al. | 328/164 X |

*Primary Examiner*—Paul L. Gensler
*Attorney, Agent, or Firm*—Cameron, Kerkam, Sutton, Stowell & Stowell

[57] ABSTRACT

A pulse circuit for reshaping pulses received over a long line includes a transformer having a primary winding connected to the line and a center-tapped secondary winding. The transformer and the line are together arranged to have a time constant which is short compared to the signal pulse duration. Pulse forming means controlled by the output of the transformer reconstitute the original pulse.

7 Claims, 8 Drawing Figures

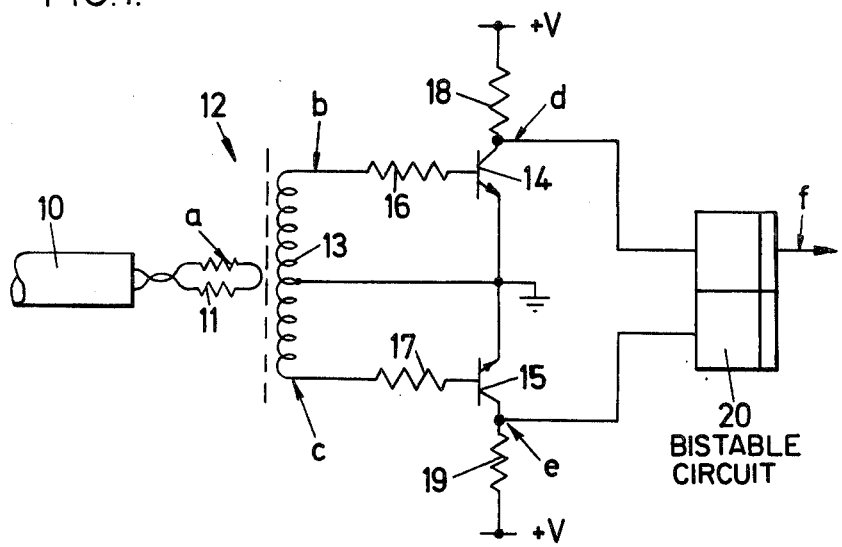

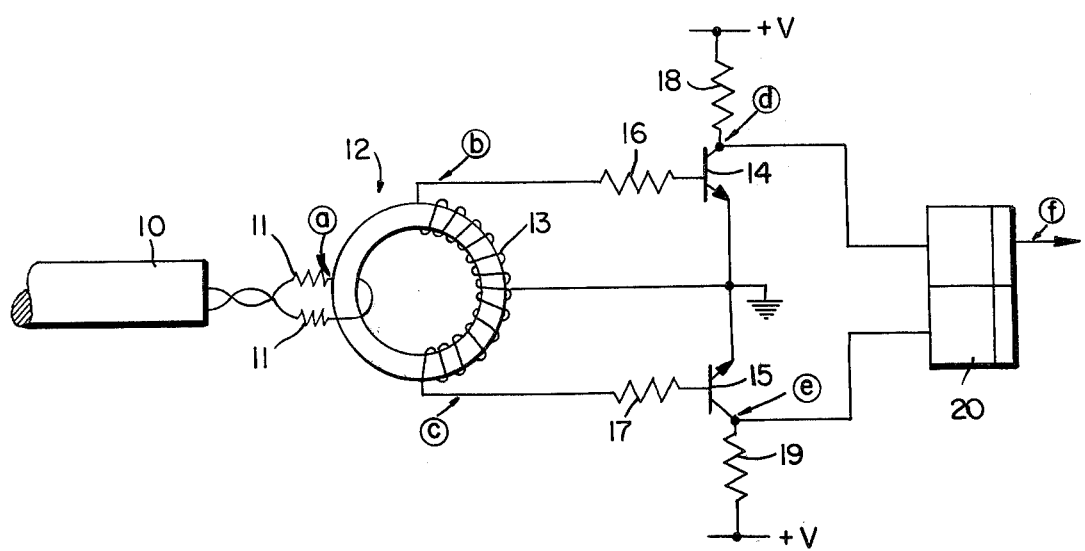

PULSE CIRCUIT FOR RESHAPING LONG LINE PULSES

This invention relates to pulse circuits, and in particular to circuits for reshaping pulses received over long lines.

In many electrical circuits signals in the form of pulses have to be passed over long lines from a source to a receiver. One of the problems which arises is that the pulse may become distorted and may be subject to interference pick-up. This problem may be avoided to some extent by the use of matched transmission lines. DC and low frequency components of the signal may be transmitted by modulation techniques, though this reduces the maximum transmission rate of the system.

The use of matched transmission lines and modulation techniques is expensive, as well as causing the reduction in transmission rate referred to above.

It is an object of the present invention to provide a pulse circuit for reshaping pulses received over a long line which does not suffer from the above-mentioned disadvantages.

According to the present invention there is provided a pulse circuit for reshaping pulses received over a long line, which includes a transformer having a primary winding connected to the line and a centre-tapped secondary winding, the transformer and line together have a time constant which is short compared to the signal pulse duration, and pulse forming means controlled by the output of the transformer to reconstitute the original signal pulse.

An embodiment of the invention will now be described with reference to the accompanying drawings in which:

FIG. 1 is a circuit diagram of a pulse circuit according to the invention; and

FIG. 2 shows waveforms occuring during the operartion of the circuit.

FIG. 3 is a circuit as shown in FIG. 1 with the core of the transformer shown in greater detail.

Referring now to FIG. 1, a long twisted-pair line is shown schematically at 10. This line is connected to the primary winding of a ferrite-core transformer 12 via a pair of resistors 11 whose purpose is to prevent signal reflection.

The transformer has a centre-tapped secondary winding 13 each end of which is connected to the base of a separate NPN transistor 14 and 15 through resistors 16 and 17 respectively. The emitters of the two transistors are connected together, to the centre-tap of the transformer secondary winding 13, and to a convenient supply voltage, say earth potential. The collector of transistor 14 is connected through a resistor 18 to a supply voltage +V, whilst the collector of transistor 15 is similarly connected through a resistor 19. The collectors of the two transistors are also connected to the "set" and "clear" inputs of a bistable circuit 20, one output of which forms the output of the pulse-shaping circuit.

The characteristics of the transformer 12 are such that the transformer 12 and line 10 together have a short time constant compared with the duration of a signal pulse. This is due largely to the construction of the transformer itself.

The transformer as shown in FIG. 3 is conveniently built-up around a cylindrical ferrite core having the centre-tapped secondary winding wound on the core in a toroidal manner. The primary winding is a single turn which passes through the centre of the core. A time constant of about 0.25 $\mu$sec may be obtained using a Mullard FX1098 core with a 24-turn secondary winding.

The use of the transformer avoids any problems due to common-mode interference picked-up by the line 10.

In operation the signal pulse reaching the transformer primary winding may have the waveform shown at $a$ in FIG. 2. The leading and trailing edges of the pulse having become considerably distorted. Due to the action of the transformer the pulses appearing at the two ends of the secondary winding have the forms shown respectively by $b$ and $c$ in FIG. 2. It will be seen that the effect of the short time constant is to differentiate the pulse applied to the transformer. The two transistors 14 and 15 act to amplify and limit these secondary pulses to whatever extent this is necessary, and also remove the unwanted one of each pair of pulses occurring on the secondary winding. Hence the pulses used to trigger the bistable circuit 20 are shown at $d$ and $e$ in FIG. 2. One of the pulses sets the bistable circuit whilst the other resets it, resulting in an output pulse from the bistable circuit which represents the original signal pulse. This output pulse is shown at $f$ in FIG. 2.

Because the original signal pulse is reformed by differentiating the received pulse there is no problem with d.c. or low-frequency components.

Although it has been stated that the time constant should be short, this could affect the response to slow transitions, and hence the actual desired time constant has to be a compromise between these two factors. However, the short time constant does mean that the transformer is insensitive to low frequency noise components, such as noise at power, audio and low radio frequencies.

The degree of amplificaion and limiting to be performed by the two transistors depends upon the situation in which the circuit is used. The simple use of two transistors may be replaced by other more complex circuitry if required.

A transformer of the type descirbed above has the effect of providing high electrical isolation between input and output. This is because the primary winding, being a single turn winding, may be provided with a high degree of insulation, for example by means of additional insulating sleeving.

What we claim is:

1. A pulse circuit for reshaping signal pulses received over a long line, which includes a transformer having a primary winding connected to the line and a centre-tapped secondary winding, the transformer and line together having a time constant such that differentiation of the received signal pulses takes place due to the action of the transformer and pulse forming means connected to the secondary winding to receive the output of the transformer and controlled by the differentiated signal pulses for reconstituting the original received pulse.

2. A circuit as claimed in claim 1 in which the primary winding of the transformer consists of a single turn winding.

3. A circuit as claimed in claim 1 in which the pulse forming means includes a bistable circuit.

4. A circuit as claimd in claim 3 in which said bistable circuit includes two inputs, means for connecting said inputs to receive control signals corresponding to a differentiated input signal from the opposite ends of the transformer secondary winding.

5. A circuit as claimed in claim 4 where said means for connecting said inputs include a pulse amplifying and clipping circuit operatively connected for removing an unwanted portion of the differentiated received signal pulse occurring at the output of the transformer.

6. A circuit as claimd in claim 2 wherein said secondary winding is wound on a ferrite core in a toroidal manner and said single turn primary winding passes through the center of the core.

7. A circuit as claimed in claim 5 wherein said pulse amplifying and clipping circuit includes at least a first transistor having a first electrode connected to one end of the secondary winding, a second transistor having a first electrode connected to the other end of the secondary winding, means for interconnecting a second electrode of each of said transistors and the center tap winding and means for biasing said transistor such that said transistors are operative in response to a portion of the differentiated received signal pulses appearing at each end of the transformer secondary winding to provide output pulses corresponding to said latter named portion and means for translating said output pulses to associated inputs of the bistable circuit to thereby set and reset the bistable circuit to provide an output therefrom representative of the original received pulse.

* * * * *